United States Patent
Mank et al.

(10) Patent No.: US 6,816,255 B2
(45) Date of Patent: Nov. 9, 2004

(54) METHOD AND APPARATUS FOR LEAK-TESTING AN ELECTROLUMINESCENT DEVICE

(75) Inventors: Adrianus Johannes Gerardus Mank, Eindhoven (NL); Peter Van De Weijer, Eindhoven (NL)

(73) Assignee: Koninklijke Philips Electronics N.V., Eindhoven (NL)

( * ) Notice: Subject to any disclaimer, the term of this patent is extended or adjusted under 35 U.S.C. 154(b) by 21 days.

(21) Appl. No.: 10/173,352

(22) Filed: Jun. 17, 2002

(65) Prior Publication Data

US 2003/0016361 A1 Jan. 23, 2003

(30) Foreign Application Priority Data

Jun. 19, 2001 (EP) .............................................. 01202372

(51) Int. Cl.[7] ................................................. G01J 3/443
(52) U.S. Cl. ..................... 356/311; 356/317; 315/169.3; 313/504; 313/506; 313/483
(58) Field of Search ................................. 356/311, 317, 356/318, 319, 326, 389, 303, 378, 379; 349/69; 438/69, 82, 99; 257/40; 313/504, 506, 483; 250/582–586, 458.1; 428/690; 315/169.3

(56) References Cited

U.S. PATENT DOCUMENTS 5,552,678 A * 9/1996 Tang et al. ............... 315/169.3

OTHER PUBLICATIONS

Lin Ke et al, Photoluminescence degradation in organic light–emitting devices, Jan. 2002, Applied Physics Letters, vol. 80, No. 4, 697–699.*
M. Schaer et al, Water and Oxygen Degradation Mechanisms in Organic Light Emitting Diodes, Apr. 2001, Advanced Functional Materials, 11, No. 2, 116–121.*
V. Savvate'ev et al, Degradation of nonencapsulated polymer–based light–emitting diodes, Dec. 1997, Applied Physics Letters, vol. 71, No. 23, 3344–3346.*
Publication by D. Braun et al, published in Synthetic Metals, 66 (1994) pp 75–79.

* cited by examiner

Primary Examiner—Frank G. Font
Assistant Examiner—Layla Lauchman

(57) ABSTRACT

A method of leak-testing an electroluminescent device includes enclosing at least one light emitting diode (LED) including LED material in a housing of the electroluminescent device such that at least a surface portion of the LED material is in contact with atmosphere within the housing, and measuring photo-oxidation of the LED material.

18 Claims, 3 Drawing Sheets

METHOD AND APPARATUS FOR LEAK-TESTING AN ELECTROLUMINESCENT DEVICE

The invention relates to a method and apparatus for leak-testing an electroluminescent device having at least one organic light-emitting diode, the device being enclosed in a housing. The invention also relates to an EL device suitable switch is for testing, or has been tested.

More particularly, the invention relates to testing an electroluminescent device comprising:

an electroluminescent element which comprises an electroluminescent organic layer disposed between a hole-injecting electrode and an electron-injecting electrode; and a housing which comprises a first shaped part, a second shaped part and an electrical leadthrough which contacts an electrode of said electroluminescent element;

said housing enclosing said electroluminescent element, said electroluminescent element being mounted on said first shaped part, said first and second shaped parts being connected to each other by means of a closed ring of a sealing material, and a clearance being present between said electroluminescent element and said second shaped part.

An electroluminescent (EL) device is a device which, while making use of the phenomenon of electroluminescence, emits light when the device is suitably connected to a power supply. If the light emission originates in an organic material, said device is referred to as an organic electroluminescent device. An organic EL device can be used, inter alia, as a thin light source having a large luminous surface area, such as a backlight for a liquid crystal display or a watch. An organic EL device can also be used as a display if the EL device comprises a number of EL elements, which may or may not be independently addressable.

The use of organic layers as an EL layer in an EL element is known. Known organic layers generally comprise a conjugated, luminescent compound. Said compound may be a low-molecular type, forming an organic LED (O-LED), e.g. a low-molecular dye, such as a coumarin, or a high-molecular type type, forming a polymer LED (P-LED), such as a poly (phenylenevinylene). The EL element also comprises two electrodes, which are in contact with the organic layer. By applying a suitable voltage, the negative electrode, i.e. the cathode, will inject electrons and the positive electrode, i.e. the anode, will inject holes. If the EL element is in the form of a stack of layers, at least one of the electrodes should be transparent to the light to be emitted. A known transparent electrode material for the anode is, for example, indium tin oxide (ITO). Known cathode materials are, inter alia, Al, Yb, Mg:Ag, Li:Al or Ca. Known anode materials are, in addition to ITO, for example, gold and platinum. If necessary, the EL element may comprise additional organic layers, for example, of an oxadiazole or a tertiary amine, which serve to improve the charge transport or the charge injection.

An EL device of the O-LED type is disclosed in a publication by Burrows et. al., published in Appl. Phys. Lett. 65 (23), 1994, 2922. Said known device consists of an organic electroluminescent element which is built up of a stack of an ITO layer, an EL layer, a hole-transporting layer and a metal (in casu Mg:Ag) layer, which is provided with a silver layer. Said EL element is surrounded by a housing consisting of a bottom plate and a top plate which are made of glass, said plates being interconnected by an epoxy-based adhesive for sealing. Said ITO layer also forms the electrical leadthrough for the anode; the Mg:Ag/Ag layers also form the electrical leadthrough for the cathode. Said leadthroughs are insulated from each other by a layer of silicon nitride.

A polymer-LED device using a soluble poly (dialkoxy p-phenylenevinylene) as the emitting material is described in a publication by D. Braun et al., published in Synthetic Metals, 66 (1994) pp 75–79.

A percentage of the known devices has disadvantages which renders them unsuitable for use in durable consumer goods, such as a display or a backlight for a liquid crystal display or a watch. Already after several hours, the uniformity of the luminous surface deteriorates which can be observed with the unaided eye. Said deterioration, which also takes place when the EL device is not in operation, manifests itself, for example, by so-called "dark spots" which are formed so as to be dispersed on the entire luminous surface.

Therefore, it is common practice to submit EL devices after manufacture to certain standard durability tests.

In a first test, i.e. a climate test, an EL device is immersed, under otherwise ambient conditions, in a water bath of 80° C. for approximately 10 seconds and, immediately afterwards, in a melting ice bath for approximately 10 seconds. This procedure is repeated a number of times for 48 hours. After drying, a voltage of 6 V is applied to the electrodes as a result of which a luminous surface emitting light emerges. The luminous surface is checked on the presence of dark spots.

In a second test, a shelf life test, an EL device is stored at an elevated temperature and the luminance and the current are measured at regular intervals at a voltage of 6 Volt. For at least 650 hours, the constancy of the current and of the luminance are checked.

Lifetime tests of (organic) LEDs have shown that the exclusion of water from the devices is critical. To avoid contact with water, LED elements can be deposited on glass and covered with a metal hood (cover) sealed to the glass by means of an (organic) adhesive like an epoxy resin. An alternative is the use of a glass cover and a metal seal. The atmosphere inside the device can be Ar or N2. Because the sealing materials used up to now are not considered to be entirely impermeable to air, complete exclusion of water is difficult. This factor is likely to be the lifetime-determining factor with regard to shell life. To prolong the lifetime of a device, a powder may be added in the enclosure that serves as a getter for water. The getter may be, for example, a BaO getter or a CaO getter. The use of a getter, however, has a practical disadvantage for the manufacturer. It makes fast visual identification of devices with leaks difficult, as damage to the device in the form of black spots in the luminescent material is postponed. In practice the leaky devices will have a very short shelf life and they should be rejected before delivery to the customer.

It is therefore, one of the objects of the present invention to overcome, or reduce, the above disadvantage by providing a method which allows detection of leaks in electroluminescent devices without substantially any delay. The principal method of the invention for leak-testing an electroluminescent device having at least one light-emitting diode, the device being enclosed in a housing, involves local photo-oxidation of the LED material. In order that the test is not destructive, the area where the photo-oxidation takes place (by means of irradiation) should be outside the active (functional) electroluminescent area.

When air penetrates the encapsulating seal, water is immediately removed by a reaction with the (BaO) getter. As mentioned before, this makes the direct detection of water difficult. However, in the case of a leak, not only water but also oxygen will penetrate the seal and will form part of the atmosphere inside the device. The invention is based on the recognition that photo-degradation of luminescent (organic) materials is increased significantly in the presence of oxygen. This effect is used by irradiating a surface portion of the LED material with light of a predetermined wavelength and measuring whether the photo-luminescence signal of said surface portion of the LED material decreases. A decrease is an indication of a leak.

The photo-luminescence method is fast and can detect leaks in the seal in less than one minute, the duration in particular not exceeding 10 or even 3 seconds, which would take a day to be detectable by the occurrence of black spots. Oxygen concentrations as low as 40 ppm have been detected, so very small leaks can be detected.

Within the framework of the invention the above properties provide the possibility of an on-line leak-tester in the production process. In view of this, a second aspect of the invention provides an EL device suitable for testing as defined in claim 19, and a third aspect of the invention provides an EL device which has been tested as defined in claim 20.

In view of the above, a feature of the invention is to select a surface portion of the LED material which is in contact with the atmosphere in the housing, to irradiate said surface portion with light in a predetermined wavelength range, whereby the irradiated material emits light, to detect said emission, to generate an output signal which is proportional to an intensity of the detected emission, and to analyze said output signal on a decrease in time of an emission property. The irradiating light has a wavelength which brings the LED material to a luminescent state.

According to a further feature, the analysis takes place in a predetermined period of time. This period may advantageously be one minute or less, so that the leak testing can be done very quickly, allowing in particular on-line testing during manufacture.

The emission can be detected by using e.g. a spectrometer, but in a simple method of detecting the emission, a photo-electric detector can be used advantageously. The invention also relates to an apparatus for leak testing an electoluminescent device having at least one light-emitting diode enclosed in a housing.

Further detail and these or other advantages of the present invention will become apparent from the following description of preferred embodiments and accompanying drawings.

Figure 1:
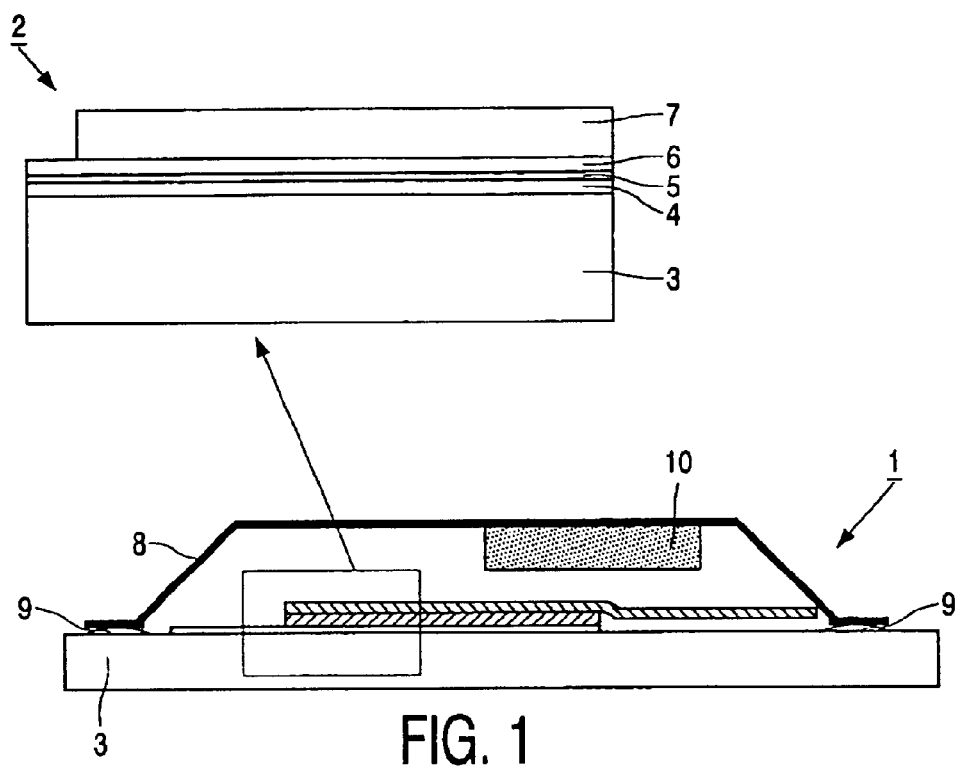
FIG. 1 is a schematic, cross-sectional view of an electroluminescent device.

FIG. 1 illustrates schematically the major part of an EL device 1. The EL device 1 comprises a (glass) substrate 3 (thickness of the order of 1 mm) which supports an EL element 2. The EL element 2 is a layer stack comprising a conducting layer 4 of ITO (thickness of the order of 150 nm), a transparent PEDOT anode layer 5 (thickness of the order of 200 nm) an electroluminescent, light-emitting, (organic) layer 6 (thickness of the order of 100 nm) and a metal cathode layer 7 (e.g. 5 nm BA covered with 100 nm Al). The EL element 2 is enclosed between the glass substrate 3 and a, free standing, metal cover lid 8 which is bonded to the glass substrate 3 by means of an epoxy edge seal 9. A getter 10 (BaO and/or CaO) is arranged inside the encapsulation to remove water penetrating the epoxy seal 9.

A particular embodiment in accordance with the invention is characterized in that the organic layer comprises an electroluminescent polymer. Electroluminescent polymers are suitable EL materials. They have good luminescent properties, a good conductivity and good film-forming properties. If use is made of simple techniques, such as spin coating, EL layers having an extended area can be manufactured by means of these materials. Suitable polymers generally have a conjugated "backbone", such as soluble poly-phenylenevinylenes, soluble poly-thiophenes and soluble poly-phenylenes. Poly-phenylenevinylenes are very suitable EL materials. By means of substitution, in particular in the 2- and 5-positions of the phenyl ring, the emission spectrum can be varied and readily soluble and processable variants can be obtained. In addition, said polymers are generally readily processable and yield amorphous layers. Polymers which are particularly suitable are 2,5 alkyl- or alkoxy-substituted poly-phenylenevinylenes.

Examples of particularly suitable poly-phenylenevinylenes are:

poly(2-methyl-5-(n-dodecyl)-p-phenylenevinylene)

poly(2-methyl-5-(3,7-dimethyloctyl)-p-phenylenevinylene)

poly(2-methyl-5-(4,6,6-trimethylheptyl)-p-phenylenevinylene) poly(2-methoxy-5-decyloxy-p-phenylenevinylene)

poly(2-methoxy-5-(2-ethylhexyloxy)-p-phenylenevinylene) (MEH-PPV).

The above materials are particularly suited for use with the inventive photo-luminescent leak detection method.

Since 1994 the stability of organic (polymer) LEDs has increased from a few hours under inert atmosphere for small active areas (a few mm$^2$) to more than 30,000 hours under ambient conditions for a backlight geometry (8 cm$^2$). In order to obtain these long lifetimes, encapsulation of the LED is necessary to avoid the interaction of water and oxygen with the LED. A common way of encapsulating a LED is the application of a free-standing cover that is mounted with an edge-seal. An occasional leak in the encapsulant results in a drastic decrease of the operational lifetime. Obviously, leak devices should be detected and rejected directly after processing.

In the metal-seal encapsulation concept, a glass cover is used. The cover is sealed at the edges with InSn solder. The detection of leaks in the metal-seal concept is straightforward. Water penetrating holes in the encapsulant results in the formation of black spots. A shelf test overnight at 80° C./50% RH is usually more than sufficient to observe the black spots visually. An important drawback of the metal-seal encapsulation process is the electrical conductivity of the seal. This means that electrode contacts have to be insulated with respect to the metal seal for at least one polarity. In the case of a single pixel device like the backlight geometry, only one contact has to be insulated. For a matrix display, however, hundreds of contacts should be insulated both with respect to the seal and with respect to neighboring contacts at sub-mm lateral distance. Such a process is considered to be too complicated.

As an alternative to the metal-seal encapsulation concept, a glue-seal concept is used. This encapsulation process is currently applied in the commercially available matrix displays. As the permeability of the glue seal with respect to water and oxygen is significant, a getter is used to eliminate the effect of water penetration through the seal. Penetration of oxygen is assumed to be irrelevant in this concept, if illumination of the device with blue or UV-light is avoided to prevent photo-oxidation. Insulation of the electrode contacts is not necessary with a glue seal because of the insulating properties of the seal.

The detection of leaks in the glue-seal concept on the basis of a shelf test is less straightforward than for the metal-seal concept. Small amounts of water penetrating the cavity of the device, corresponding to small leaks in the encapsulant, do not result in the formation of black spots as this water is consumed by the getter. It will, however, lead to a reduction of the (shelf) life of the LED as the functionality of the getter decreases more rapidly. As the shelf life at 80° C. and 50% RH is estimated to be a few thousand hours, it is a cumbersome task to measure a fractional decrease of it as a result of a small leak in the encapsulant. Therefore, the need for a fast and non-destructive leak tester has become more urgent when changing from the metal-seal to glue-seal encapsulation process of LEDs.

A schematic diagram of a LED to be tested is given in FIG. 1.

When air penetrates the glue that is used as a seal in the encapsulation method, water is immediately removed by a reaction with the CaO- or BaO-getter. As mentioned before, this hampers the direct detection of water. However, in addition to water, oxygen will penetrate the glue and will be part of the atmosphere inside the device. It is known from literature that photo-degradation of luminescent polymers is increased significantly in the presence of oxygen.

Degradation of PPV, the luminescent material applied in polymer LEDs, can take place by a photo-oxidation reaction. IR-measurements confirm this. During degradation the intensity of the C=C absorption peak (970 cm$^{-1}$, vinyl double bond in the PPV-backbone) decreases while the C=O absorption peak (1700 cm$^{-1}$) increases. In addition, a broad absorption band ranging form 2400 to 3500 cm$^{-1}$ is formed which is indicative of an O—H stretching vibration in a carboxylic acid. Clearly, the vinyl double bond is broken and replaced by a carboxylic acid function. This means that actual chain scission takes place. Studies indicate that one C=O per 400 vinyl-groups is already sufficient to reduce the photoluminescence by a factor of 2.

The mechanism involved in the photo-oxidation is considered to be as follows: upon absorption of a photon, the PPV is excited to a singlet state. Intersystem crossing allows the transfer for some of the PPV to the (lower lying) excited triplet state. A nearby oxygen molecule, which has a triplet ground state, can be sensitized by the triplet state of the PPV. In this process, the excitation energy is transferred from the polymer to the oxygen, which is excited to a singlet state. This singlet oxygen is very aggressive and attacks the vinyl double bond. As a result, photo-oxidation occurs, which reduces the length of the conjugated π-system and lowers both absorption at long wavelengths and the subsequent photo-luminescence.

Experiments with 88% conjugated PPV showed that the degradation occurs 1000× faster in air than in a vacuum environment (10$^{-5}$ mbar). Water did not have a major effect on the photo-degradation. Changes in the chemical composition of the side-chain substitution did not have a large effect on these results and the effect is clearly linked to the PPV-backbone.

Figure 2:
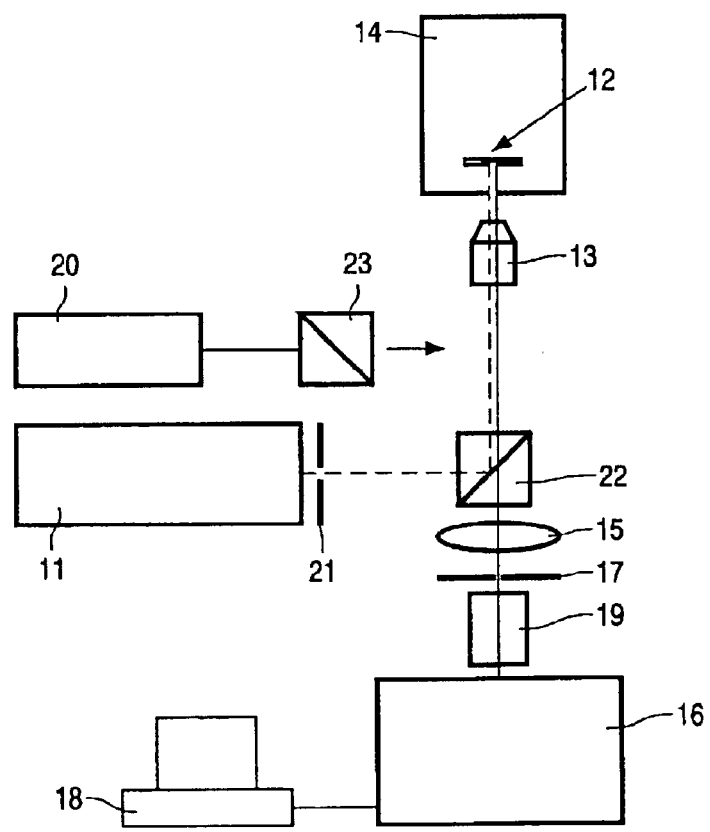
FIG. 2 is a schematic diagram illustrating how photo-oxidation of a LED element is detected by measuring photo-luminescence.

The inventive method of detecting of leaks in polymer LEDs is based on the photo-oxidation effect. The only supposition made is that leaks through which water can be transported also allow the transport of oxygen into the nitrogen-filled encapsulation. It turns out that the presence of oxygen in a leaky device is sufficient for a fast photo-oxidation effect. Equipment for the detection of photo-degradation is shown in FIG. 2. A Laser 11 (Ar-ion; 514 nm or Kr-ion; 486 nm) is used to excite the PPV material inside the (poly) LED device 12. To obtain the largest possible effects, a long excitation wavelength of 514 nm is used to excite only the longest conjugated systems. In this way, the blue shift in the spectrum that accompanies photo-oxidation, results in a decrease in absorption and, as a result, in a decrease in luminescence.

As the metal cathode is very effective in shielding the polymer from oxygen enhanced photodegradation, the presence of oxygen can only be measured in the uncovered PPV-material. In a LED backlight, this area is very small (1 to 2 mm wide rim around the cathode). Therefore, a lens 13 (e.g. microscope objective) is used to aim the laser spot used for irradiation. All analyses have been performed in focus. The (poly)LEDs can be positioned reproducibly with a specially designed XYZ-stage 14. A video system (camera+ monitor) may advantageously be used to determine whether a selected surface area is suited for leak testing or not (is it uncovered by metal or not). The camera 20 receives an image through a beam splitter 23 which can be placed in the light path and the video system may thus be used to steer the positioning system 14. Luminescence is collected with a lens 15 and focused on (a collection fiber 19 of) an analyzing spectrometer 16 equipped with a CCD. The excitation light produced by the laser 11 is reflected towards LED device 12 by a notch filter 22 which is reflective to the laser wavelength but transmissive to the luminescence light. Standard absorption filters were found to yield a high luminescence background and could therefore not be used. The spectral characteristics of the luminescence may be analyzed with the spectrometer 16 and data are processed with a computer.

Preliminary experiments show that degradation occurs in the presence of both light and 20% of oxygen. They also show that this effect is irreversible. In practice, however, degradation may be less pronounced if a very small leak is present. Some form of calibration is required to determine lower limit of the size of a leak that can be detected with this method. To obtain more detailed information about the photo-degradation in the presence of oxygen, the arrangement of a confocal hole 17 allows to obtaining information from a limited region and excluding signals from other parts of the (poly)LED.

To further improve the sensitivity and selectivity of the method, the same objective 13 is used for excitation and luminescence collection. If such a system is also equipped with a camera 20, spot sizes can be easily controlled. This would also improve the robustness of the method, because the power density can be kept constant for the various devices tested.

A practical system is based on a LabRam Raman spectrometer from Dilor (Lille, France). The Ar-ion laser is a Lexel 85, which can be operated between 50–500 mW at 514 nm. A filter wheel 21 with different neutral density filters is positioned in front of it (D0.3–D4, reducing power between a factor of 3 and 10000). This makes it possible to reduce the laser power density, if desired. The minimum spot size available with this system is diffraction-limited. Beam splitters 22, 23 allow collection of either luminescence spectra or looking at the image of the sample. The image of the sample also comprises the image of the reflected laser beam.

When a surface is encountered, the spot size of the reflected laser beam is at its minimum (focal point for the reflection). In this way, the thin organic layer in the (poly) LED is easily located through the glass cover. It also allows control over the spot size (and power density) that is used for the analysis. The photoluminescence spectrum is analyzed with spectrometer 16 using a monochromator (300 mm focal length), equipped with a 600 lines/mm or 1800 lines/mm grating. In combination with a Spectrum One CCD (charge-coupled device), information can be obtained for a spectral range of 140 nm during a single analysis. Finally the data are stored on a computer 18. Time-resolved analysis is possible with a minimum data collection time of 0.1 s per spectrum.

Detailed time-resolved data have been collected at three power levels (0.25 mW, 0.025 mW and 0.0025 mW) on a surface of 2×2 micron.

The data for a series of poly-LED backlights are presented in the table, which relates to luminescence signals at the uncovered edge of LED elements as a function of intensity and time:

| Status | Power (W/cm²) | Signal at t= 1 s Good | Signal at t= 1 s Leak | Signal at t = 3 s Good | Signal at t = 3 s Leak | Signal at t = 10 s Good | Signal at t = 10 s Leak |
|---|---|---|---|---|---|---|---|
| | 5000 | 20000 | 1000 | 17500 | 90 | 15500 | 35 |
| | 500 | 22000 | 800 | 21500 | 350 | 21000 | 230 |
| | 50 | 15000 | 5500 | 15000 | 2800 | 15000 | 1500 |

In order to test the viability of the method, a large series of samples (329 devices) were tested on the basis of their luminescence signal. The age of the samples was 16 weeks when they were submitted to the leak luminescence leak tester. This means that the devices were stored under ambient conditions for 16 weeks. In this period, 7 devices showed black spots.

All samples were irradiated with 2.5 kW/cm² laser power density for 10 s, using the same conditions as described above. On the basis of the calibration measurements, a high luminescence signal (30 k counts) is expected that remains constant in the period of observation, if the device has a proper encapsulation (no leak). Indeed, 308 out of 329 devices showed such a behavior (see FIG. 4 as an example). Samples that show a low (<10 k counts) and strongly decreasing luminescence signal are considered to be leaking (see FIG. 18). This population of samples (7 devices) matches the observation of black spots that were formed during the 2500-hour shelf test at room temperature.

Figure 3:
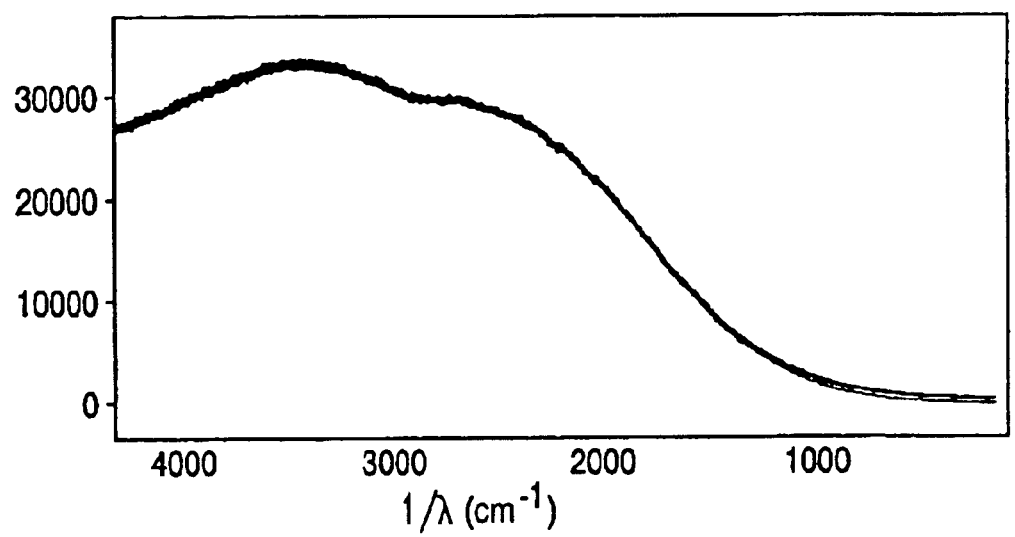
FIGS. 3, 4, 5 and 6 show the results of luminescence measurements on 4 different devices.

FIG. 3 shows the results of luminescence measurements on a device 300402D1. The luminescence intensity is high (>30 k counts) and no significant decrease in luminescence intensity could be observed. The plot comprises 11 subsequent measurements during the period of observation (10 s). The device has no leak.

Figure 4:
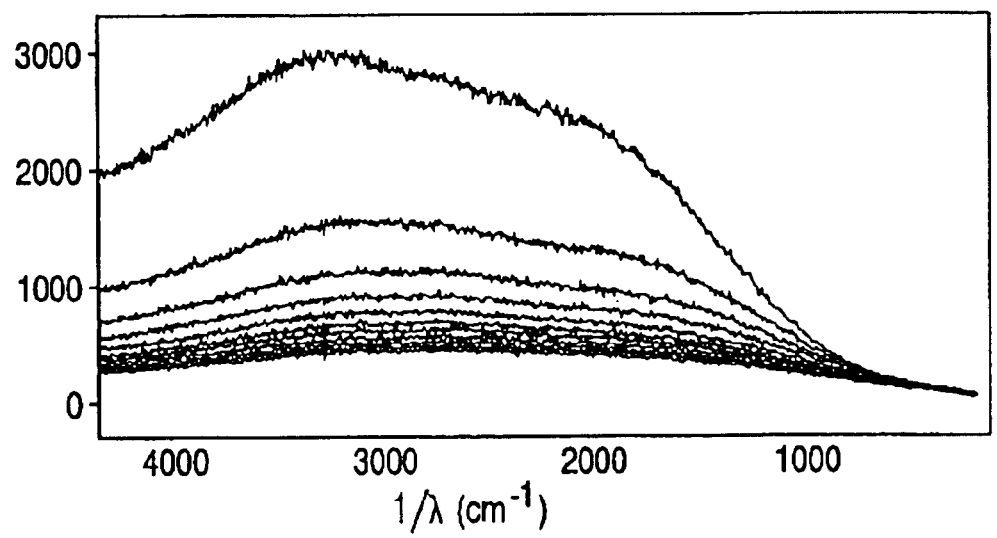

FIG. 4 shows the results of luminescence measurements on a device 100205A8. The luminescence intensity is low (<10 k counts) and a very large decrease in luminescence intensity could be observed in the 10 subsequent measurements during the period of observation (10 s). The device has a leak, for it showed black spots after the 2500-hour shelf test prior to the leak test.

The remaining population of samples (14 devices) showed an intermediate behavior. One sample showed a significant lower luminescence signal (15 k counts) and a distinct decrease (30%) during the period of observation (see FIG. 5). The device did not show black spots at the start of the leak test (after 2500 hours of shelf test at room temperature), but a shelf test at 80° C./50% relative humidity for 500 hours resulted in the formation of black spots. This confirms the presence of a leak in the encapsulation. A population of 12 devices showed a high luminescence signal (around 30 k counts), but during the period of observation a slight decrease in intensity (10–20%) was observed (FIG. 6). These devices have a small leak in their encapsulation. The leak is so small that the 2500-hour shelf test at room temperature followed by a high temperature shelf test at 80° C. for 500 hours does not result in the formation of (visible) black spots. Further testing would reveal the formation of black spots. The shelf lifetime of these devices will be shorter than for devices that show no decrease of their luminescence signal.

Figure 5:
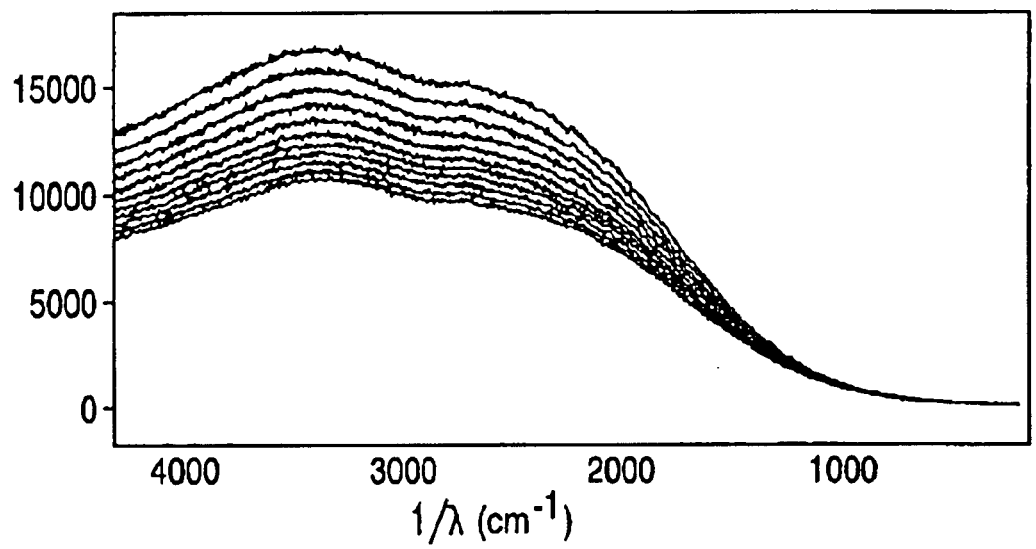
Figure 6:
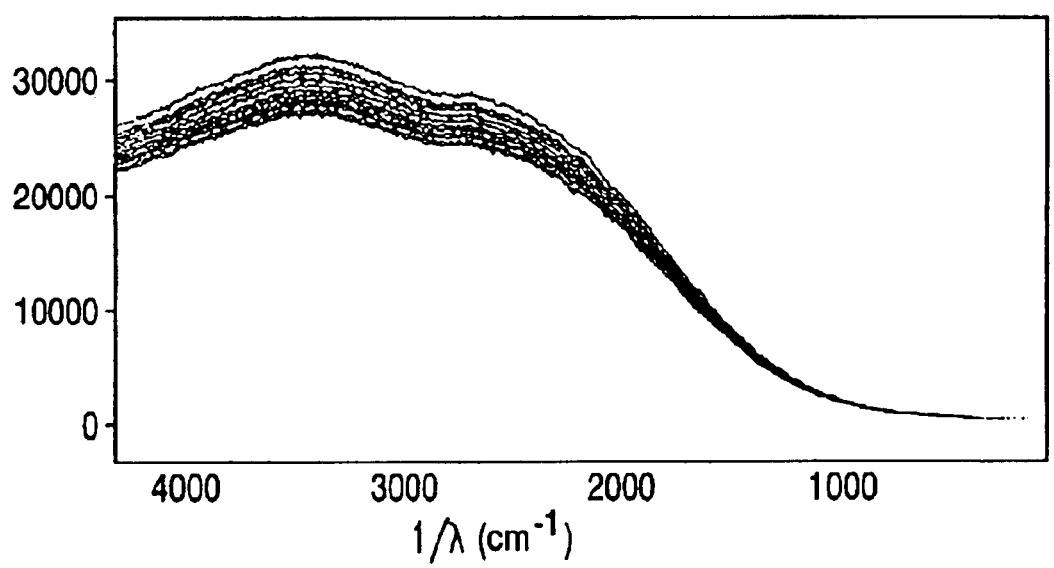

FIG. 5 shows the results of luminescence measurements on device 300409B2. The luminescence intensity is moderate (15 k counts) but a significant decrease in luminescence intensity could be observed in the 11 subsequent measurements during the period of observation (10 s). A subsequent shelf test at 80° C. and 50% relative humidity showed the formation of black spots, thus confirming the presence of a leak in the encapsulation.

FIG. 6 shows the results of luminescence measurements on device 301403C3. The luminescence intensity is high (30 k counts) but a small decrease in luminescence intensity (10%) could be observed in the 11 subsequent measurements during the period of observation (10 s). The device is considered to have a leak, but the leak in its encapsulation is so small that no black spot formation could be observed after a subsequent shelf test at 80° C. and 50% relative humidity.

In summary, the invention relates to a method of detecting the leak-in of oxygen in an organic electroluminescent device via the extent of photo-degradation of the electroluminescent organic material. The photo-degradation of the electroluminescent organic material is induced by the presence of oxygen, and can be detected by comparing the photo luminescence of the material, before and after illumination of the material with light (e.g. from a laser).

Photo-degradation due to the presence of oxygen in an encapsulated organic electroluminescent device is evidence for a leak in the device, which leak will result in a shorter lifetime of the device.

The invention provides a fast, non-destructive method of inspecting organic electroluminescent devices on leakage, immediately after their production. Leak devices can be identified and discarded, even on-line.

What is claimed is:

1. A method of leak-testing an electroluminescent device, the electroluminescent device including at least one light emitting diode (LED) including LED material, comprising:
   enclosing the LED material in a housing of the electroluminescent device such that at least a surface portion of the LED material is in contact with atmosphere within the housing,
   and measuring photo-oxidation of the LED material.

2. The method of claim 1 wherein measuring the photo-oxidation of the LED material includes:
   selecting a surface portion of the LED material that is in contact with the atmosphere in the housing,
   irradiating said surface portion with light,
   detecting light emitted from the irradiated material,
   generating an output signal representative of the intensity of the detected emitted light,
   analyzing said output signal on a decrease in time of an emission property.

3. The method of claim 1, wherein the analysis takes place in a predetermined period of time.

4. The method of claim 1, wherein the emission is detected by using a photo-electric detector.

5. The method of claim 1, wherein the irradiating light has a wavelength that brings the LED material to a luminescent state.

6. The method of claim 1, wherein the LED material is an organic polymer.

7. The method of claim 6, wherein the LED material is a PPV material.

8. The method of claim 1, wherein the housing accommodates a getter.

9. The method of claim 1, including performing the testing on-line during manufacture of the electroluminescent device.

10. The method of claim 1, including rejecting the electroluminescent device the decrease surpasses a predetermined value.

11. An apparatus for leak testing an electroluminescent device having at least one fight-emitting diode, the at least one LED being encapsulated in a housing, said apparatus comprising:

a source for emitting light in a predetermined wavelength range, said emitted light defining an optical path for irradiating a surface portion of the LED of the electroluminescent device to be tested, means for collecting and detecting the photo-luminescent radiation emitted by said surface portion upon Irradiation by the light from the source, means for generating an output signal which is proportional to an intensity of the detected photo-luminescent radiation.

12. The apparatus of claim 11, further comprising means for processing the output signal and for generating a reject signal in the case of a leaky electroluminescent device.

13. The apparatus of claim 11, wherein the light source is a laser.

14. The apparatus of claim 13, wherein the laser produces light of a wavelength which predominantly excites the longest conjugated systems of the organic LED material.

15. The apparatus of claim 13, wherein the wavelength is longer than 450 nm.

16. The apparatus of claim 11, wherein one and the same lens is used for irradiating a surface portion of a LED and for collecting of the photo-luminescent radiation of said surface portion.

17. The apparatus of claim 11, further comprising a video system to determine whether a selected surface area of a LED is suited for leak-testing or not.

18. The apparatus of claim 11, further comprising a filter in the path of the photo-luminescent radiation, said fitter being capable of transmitting the photo-luminescent radiation but being non-transmissive to the light emitted by the source.

* * * * *